US006614866B2

United States Patent
Hafez et al.

(10) Patent No.: US 6,614,866 B2
(45) Date of Patent: *Sep. 2, 2003

(54) PHASE LOCKED-LOOP USING SUB-SAMPLING

(75) Inventors: Amr N. Hafez, Waterloo (CA); Mohamed I. Elmasry, Waterloo (CA)

(73) Assignee: Research In Motion Limited, Waterloo (CA)

(*) Notice: Subject to any disclaimer, the term of this patent is extended or adjusted under 35 U.S.C. 154(b) by 0 days.

This patent is subject to a terminal disclaimer.

(21) Appl. No.: 10/222,504

(22) Filed: Aug. 16, 2002

(65) Prior Publication Data

US 2002/0191728 A1 Dec. 19, 2002

Related U.S. Application Data

(63) Continuation of application No. 09/579,088, filed on May 25, 2000, now Pat. No. 6,463,112.

(51) Int. Cl.[7] .................................................. H03D 3/24
(52) U.S. Cl. ..................................... 375/376; 327/157
(58) Field of Search ................................ 375/376, 294; 327/157, 156, 147; 331/18, 25

(56) References Cited

U.S. PATENT DOCUMENTS

| 4,458,214 A | 7/1984 | Lakomy |
| 4,584,539 A | 4/1986 | Stankey |
| 4,720,688 A | 1/1988 | Hasegawa et al. |
| 4,755,774 A | 7/1988 | Heck |
| 5,184,093 A | 2/1993 | Itoh et al. |
| 5,343,168 A | 8/1994 | Guthrie |
| 5,764,711 A | 6/1998 | Jokura |
| 5,781,600 A | 7/1998 | Reeve et al. |
| 6,163,232 A | 12/2000 | Hofmann |

Primary Examiner—Temesghen Ghebretinsae
(74) Attorney, Agent, or Firm—Jones Day; Krishna K. Pathiyal, Esq.; Charles B. Meyer, Esq.

(57) ABSTRACT

A PLL-based frequency synthesizer is provided. In accordance with one aspect, a phase locked loop is provided that comprises a phase detector, a loop filter, a voltage controlled oscillator, and a feedback circuit. The phase detector has as inputs a reference frequency signal and a feedback signal. The phase detector is operable to generate a phase detection signal based on a comparison of phases between the reference frequency signal and the feedback signal. The loop filter is coupled to the phase detector for receiving the phase detection signal and generates an output voltage in response to the phase detection signal. The voltage controlled oscillator is coupled to the output voltage of the loop filter and generates a local oscillator signal. The feedback circuit is coupled to the local oscillator signal and generates the feedback signal. The feedback circuit comprises a sampling circuit. The sampling circuit is operable to sample the local oscillator signal with a sampling frequency that is substantially less than the frequency of the local oscillator signal to generate a sampling circuit output signal. The sampling circuit output signal comprises a beat frequency signal having a beat frequency that is equal to the frequency difference between the frequency of the local oscillator signal and the nearest harmonic of the sampling frequency. The feedback signal is derived from the beat frequency signal.

20 Claims, 11 Drawing Sheets

PHASE LOCKED-LOOP USING SUB-SAMPLING

CROSS-REFERENCE TO RELATED APPLICATIONS

This application claims priority from and is related as a continuation application to U.S. Non-Provisional application Ser. No. 09/579,088 entitled "Phase Locked-Loop Using Sub-Sampling," which was filed on May 25, 2000 now U.S. Pat. No. 6,463,112. The entire disclosure of U.S. Non-Provisional application Ser. No. 09/579,088 is hereby incorporated into the present application by reference.

BACKGROUND OF THE INVENTION

1. Technical Field

The present invention is in the field of phase locked-loop (PLL)-based frequency synthesizers. More specifically, the present invention provides a PLL-based frequency synthesizer with a sub-sampling feedback loop that is particularly well-suited for use in a wireless device.

2. Description of the Related Art

The frequency synthesizer is an important element in any wireless device. It is responsible for generating a sinusoidal output signal with an accurate frequency that is used to translate the frequency band of the information channels transmitted by the wireless device. By tuning the frequency synthesizer, channel selection among the information channels is achieved. The spectral purity of the frequency synthesizer's output signal has an effect on the information signal selected, which is typically converted down to baseband or to an intermediate frequency. The spectral purity of this output signal is characterized by the amount of spurious signals and the amount of phase-noise.

Figure 1A:
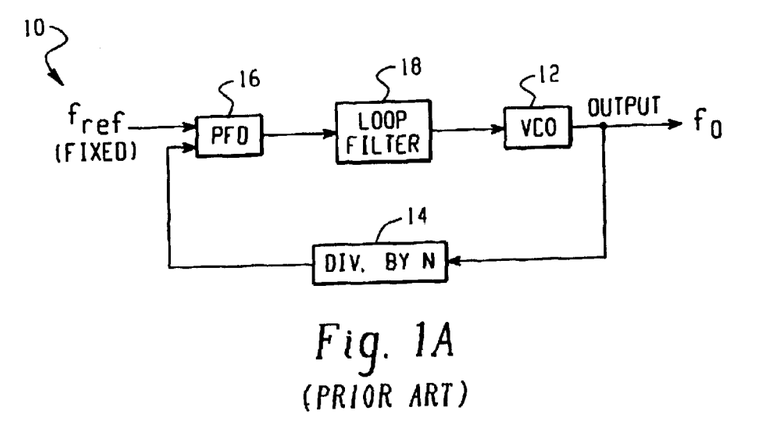
FIG. 1A is a circuit schematic of a conventional phase-locked loop.

FIG. 1A sets forth a prior art PLL-based frequency synthesizer utilizing a voltage-controlled oscillator (VCO) 12 configured in a feedback loop. In this circuit, the frequency output of the VCO ($f_O$), which is the output signal from the frequency synthesizer, is divided down to a low frequency using a 1/N divider circuit 14, and then fed back to the VCO 12 input through circuits 16, 18. The divider 14 output signal is coupled to one input of a phase-frequency detector (PFD) 16. A fixed reference frequency, $f_{ref}$, is coupled to the other input of the PFD 16. The output of the PFD 16 is coupled to and filtered in a loop filter 18, which sets the bandwidth and spurious rejection of the circuit. The output of the filter 18 is then coupled to the input of the VCO 12.

In the PLL shown in FIG. 1A, the reference frequency ($f_{ref}$) is fixed and is derived from an external crystal oscillator (not shown). Tuning in this prior art circuit is achieved by changing the division ratio N. Since N is an integer, the tuning step will be equal to $f_{ref}$. Hence, $f_{ref}$ must be chosen to be equal to the desired channel spacing according to whatever wireless standard is associated with the wireless device. Due to spurious rejection considerations, the loop bandwidth (BW) is typically limited to approximately $f_{ref}/10$. Having such a small bandwidth, this prior art circuit generally does not inhibit the VCO's phase-noise over the frequency range of interest. It is only by increasing the power of the VCO 12, and/or using an off-chip VCO, that the desired phase-noise performance can be attained in this prior art scheme.

A major source of phase-noise in such a PLL 10 is the VCO 12. The phase-noise of a free-running VCO is generally inversely proportional to its power consumption and drops quadratically with the offset from the circuit's center frequency. When configured in a PLL, the phase-noise of the VCO is inhibited within the bandwidth (BW) of the PLL. This is due to the fact that, within it's BW, the PLL corrects for any jitter occurring in the VCO. Thus, in order to reduce the phase-noise caused by the VCO, it is desired to increase its BW. However, this is in conflict with the other objective of maintaining adequate spurious rejection.

The spurious tone in a PLL arises from the input reference frequency. This is due to the fact that the PFD 16 in FIG. 1A produces pulses every cycle of the input clock. Unless the loop bandwidth is small enough to reject it, this frequency will appear at the output of the PLL as discrete tones, at an offset from the carrier equal to $f_{ref}$. Hence, the bandwidth of the PLL is usually a decade less than the reference frequency.

The known architecture in FIG. 1A also has problems because of the division ratio, N. This is so because when the phase-noise in the reference signal is mapped to the output, it is multiplied by a factor of $N^2$ (or, equivalently, increased by 20 log(N) dB). Since N is usually very large (e.g., 5,000–70,000) in such PLLs, even a relatively "clean" input signal may contaminate the output spectrum.

A traditional alternative to the PLL of FIG. 1A is a fractional-N architecture, which relies on periodically hopping the division ratio (N) between two consecutive integers such that the average resulting division ratio is a fraction. While this results in a moderate reduction of the division ratio (e.g., factor of 8 or 16), a spur at the channel spacing still persists, necessitating a low BW.

Figure 1B:
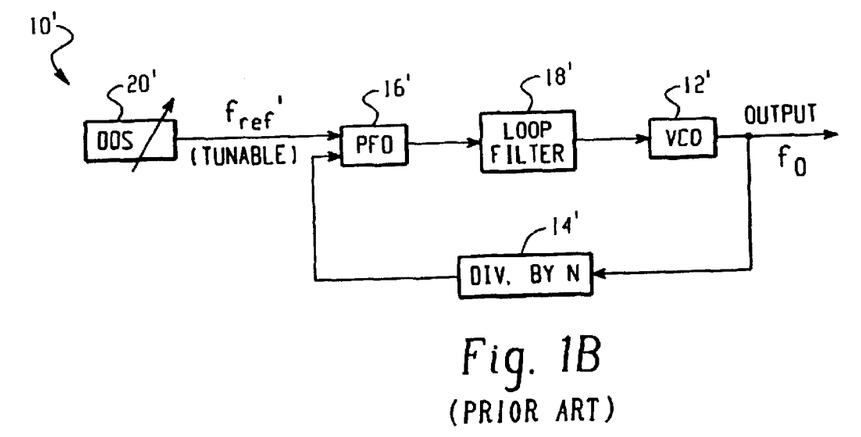
FIG. 1B is a circuit schematic of a conventional phase-locked loop driven by a DDS.

FIG. 1B sets forth another prior art circuit architecture 10' for a phase-locked loop using a VCO. Similar to the first prior art circuit of FIG. 1A, in FIG. 1B a VCO 12' is configured in a feedback loop. The output of the VCO ($f_O$) is first divided down to an intermediate frequency using a 1/N divider circuit 14', where N is an integer. The divider 14' outputs a signal that is input to a PFD 16'. A reference frequency, $f_{ref}'$ is also input to the PFD 16'. The output from the PFD 16' is fed to and filtered in a loop filter 18', which sets the bandwidth and spurious rejection of the circuit. The filter 18' then outputs a signal to the VCO 12'. In this second prior art circuit, however, the reference frequency ($f_{ref}'$) is not fixed as in FIG. 1A, but is a tunable frequency that is derived from a digital frequency synthesizer (DDS) 20', or some other type of frequency synthesizer. Using this architecture, the reference frequency ($f_{ref}'$) can be made much larger than the channel spacing and the BW proportionally increased.

This architecture, however, suffers from several problems. The primary problem relates to the selection of the division ratio N. If the division ratio N is small, then the DDS 20' will have to operate at a relatively high frequency, which leads to excessive power consumption in the circuit. This high frequency operation also leads to greater difficulty in designing the digital-to-analog convertor (DAC) at the DDS output. If the division ratio N is large, then the phase-noise of the DDS 20' will start to dominate since it is multiplied by $N^2$ when mapped to the output. Thus, the problem of phase-noise found in the prior art system in FIG. 1A is transferred in this second prior art system shown in FIG. 1B from the VCO 12 to the DDS 20.

One solution to this problem is to mix the VCO signal with the output of another PLL, thus converting down the VCO signal to a low frequency while keeping the division ratio small. However, this requires the use of a mixer operating at a high RF frequency and the use of two PLLs, which leads to high power consumption. Also, the output of the second PLL must be "clean" since it will affect the phase-noise in the frequency synthesizer output.

SUMMARY OF THE INVENTION

A PLL-based frequency synthesizer is provided. In accordance with one aspect, a phase locked loop is provided that comprises a phase detector, a loop filter, a voltage controlled oscillator, and a feedback circuit. The phase detector has as inputs a reference frequency signal and a feedback signal. The phase detector is operable to generate a phase detection signal based on a comparison of phases between the reference frequency signal and the feedback signal. The loop filter is coupled to the phase detector for receiving the phase detection signal and generates an output voltage in response to the phase detection signal. The voltage controlled oscillator is coupled to the output voltage of the loop filter and generates a local oscillator signal. The feedback circuit is coupled to the local oscillator signal and generates the feedback signal. The feedback circuit comprises a sampling circuit. The sampling circuit is operable to sample the local oscillator signal with a sampling frequency that is substantially less than the frequency of the local oscillator signal to generate a sampling circuit output signal. The sampling circuit output signal comprises a beat frequency signal having a beat frequency that is equal to the frequency difference between the frequency of the local oscillator signal and the nearest harmonic of the sampling frequency. The feedback signal is derived from the beat frequency signal.

BRIEF DESCRIPTION OF THE DRAWINGS

In order that the invention identified in the claims may be more clearly understood, preferred embodiments of structures, systems and methods having elements corresponding to elements of the invention recited in the claims will be described in detail by way of example, with reference to the accompanying drawings, in which:

DETAILED DESCRIPTION OF THE DRAWINGS

Figure 2:
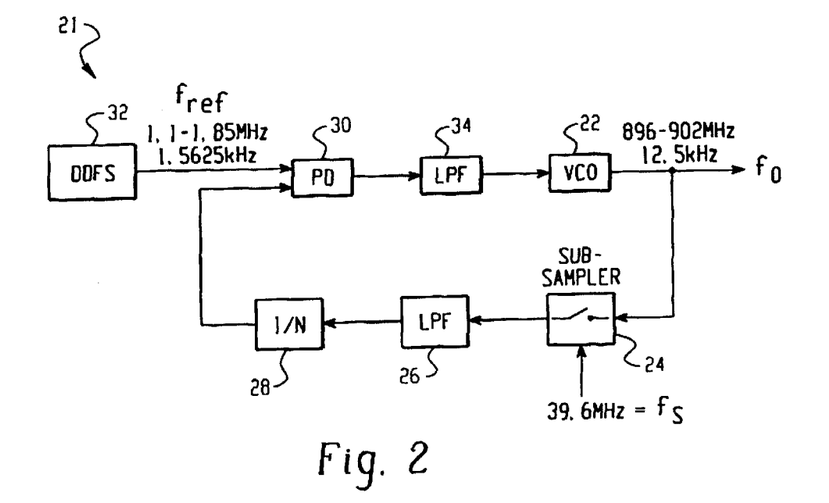
FIG. 2 is a circuit schematic of a first embodiment of a phase-locked loop frequency synthesizer.

FIG. 2 is a circuit schematic of a first embodiment of a phase-locked loop (PLL)-based frequency synthesizer 21. This circuit 21 includes a direct digital frequency synthesizer (DDFS) 32, a phase detector (PD) 30, a first low pass filter (LPF) 34, a voltage-controlled oscillator (VCO) 22, a sub-sampler circuit 24, a second low pass filter (LPF) 26 and a 1/N divider circuit 28. The sub-sampler 24, low pass filter 26 and 1/N divider circuit 28 are configured in a feedback loop feeding the output of the voltage controlled oscillator ($f_O$) (which is also the output frequency signal of the frequency synthesizer) back to one of the inputs of the phase detector 30. The other input to the phase detector 30 is the output $f_{ref}$ of the DDFS 32. The sub-sampler circuit 24 and the second low pass filter 26 form a sampler/filter system.

Operationally, the output of the VCO 22 ($f_O$) is sampled in sub-sampler 24 by a low, preferably fixed-frequency, sampling clock ($f_S$) in order to generate a reduced frequency feedback signal. The sampling clock $f_S$ is preferably derived from a crystal oscillator (not shown), thus ensuring its spectral purity so that it will not add to the phase-noise in the output signal $f_O$. Preferably, the sub-sampler 24 is a sample-and-hold circuit that dissipates very little power. Any substantial harmonics are subsequently filtered from the feedback signal using LPF 26, and the fundamental frequency of the feedback signal (which is equal to the beat frequency) is divided by a small-division-ratio in divider circuit 28. The beat frequency is defined as the frequency difference between the VCO output frequency ($f_O$) and the nearest harmonic of the sampling clock ($f_S$). For example, if the VCO frequency is 896 MHz and the sampling rate is 89 MHz, then the nearest harmonic of the sampling clock will be the one at 890 MHz (10th harmonic), and the beat fundamental output of the sampler 24 will be the beat frequency of 6 MHz.

The output of the divider 28 is compared to the reference frequency $f_{ref}$, preferably derived from a DDFS 32, at phase detector 30. The signal output by the phase detector 30 is then filtered by a loop-filter (or charge pump) 34, which also determines the bandwidth and spurious rejection, and then fed to the input of the VCO 22.

For the output frequency band shown (896–902 MHz), the fundamental frequency of the sub-sampler 24 output will range from 8.8–14.8 MHz. Also, the LPF 26 must be sharp enough to filter out the worst case harmonics that occur when the fundamental is at 14.8 MHz and the nearest image is at 24.8 MHz. The output of the LPF 26 is divided by 8 so that the DDFS 32 operates at a low frequency and consumes little power.

In this first embodiment, the sampling frequency is much lower than the VCO frequency, e.g., $f_S=f_O/10$ or less. In this range of frequencies, stable, high-quality crystal oscillators can be used to generate $f_S$. Furthermore, the sub-sampler 24 consumes considerably less power than a mixer operating at the RF frequency (i.e., about 900 MHz), since only the sampling switch must track the RF frequency, while a subsequent op-amp and filter operate at the low frequency. The noise in the sampling signal, when mapped to the output, is also increased by the sampling factor, e.g., if the sampling frequency is 10 times less than the RF output frequency, then the noise is increased by 20 log(10)=20 db. However, as discussed above, in this architecture the sampling frequency preferably comes from a high-quality crystal oscillator. These oscillators produce very pure signals with very small jitter. Therefore, the sampling frequency will result in no significant phase-noise degradation.

Utilizing this architecture produces a reduction in the division ratio N. By using sub-sampling, the VCO output is converted to a low frequency prior to the frequency divider 28. Thus, the division ratio N in the preferred architecture is only 8, as opposed to 72,000 if a classical PLL was used. This reduction in N reduces the phase-noise contribution of the phase-detector 30 by 79 dB, making it almost negligible.

Since the sampling frequency is derived from the crystal oscillator, the reduction in the division ratio N is achieved without the use of extra VCOs, mixers, or PLLs operating at high frequency that can degrade phase-noise performance. This is accomplished while maintaining a small division ratio N, thus relaxing the constraints on the second frequency synthesizer 32 at the input phase detector 30.

As discussed above, the VCO output is converted down to the 1–2 MHz range with a division ratio of only 8. Thus, the DDFS 32 will only have to provide a resolution of 1.5625 kHz with a clock of approximately 5 MHz. Hence, only 12-bits of resolution is required. Further, the DDFS maximum output frequency is 1.185 MHz and thus its clock can be as low as 5 MHz. This leads to a significant reduction in the DDFS 32 size and power consumption.

The sub-sampling operation also beneficially effects the digital-to-analog converter (DAC) (not shown) required for the DDFS 32. The truncation noise, which is determined by the DAC resolution, translates to phase-noise and/or spurs, and when mapped to the output, this noise is increased by 20 log(N), where N is the division ratio. If sub-sampling is not employed in the feedback path, the division ratio necessary for a DDFS 32 operating at the same frequency would be around 600. Thus, with the proposed architecture shown in FIG. 2, the phase-noise contribution at the output is reduced by 40 dB, thereby allowing for a lower-resolution DAC. This significantly reduces power consumption of the circuit.

In addition to reducing the division ratio (N), this architecture has a relatively high reference frequency (1–2 MHz as opposed to 12.5 kHz in a classical PLL). This higher reference frequency allows for a large bandwidth (BW) while maintaining low spurious signals. A bandwidth of 100 kHz will still be one decade less than the spurious frequency while providing nearly 40 dBc attenuation of the VCO phase-noise at 10 kHz. Thus on-chip VCOs, which typically have low quality factors, can be utilized. This greatly reduces interference problems, as well as avoids the possible extra buffers needed to drive external 50 Ohm terminations. The large bandwidth is also beneficial in that it provides a fast switching time.

Figure 3:
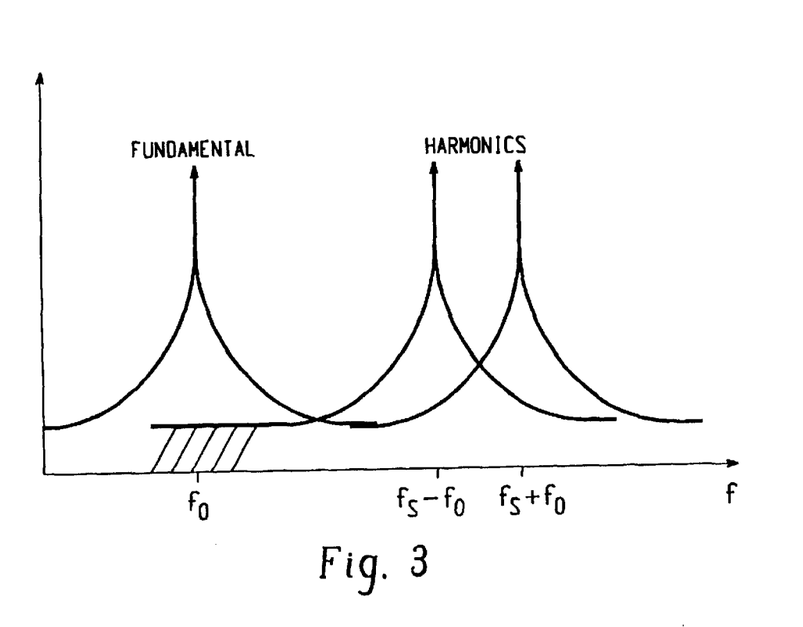
FIG. 3 is a plot showing noise folding due to sampling in the first embodiment shown in FIG. 2.

The conceptual output of the sub-sampler 24 is shown in FIG. 3, which is a plot showing noise folding due to sampling. Here, the fundamental frequency lies at 8.8 MHz, with harmonics that are 39.6 MHz apart. Thus, the noise floor of the harmonics will alias on top of the fundamental and the noise floor will increase by the ratio of the sampler's input bandwidth to the sampling frequency. However, since the noise floor (approximately −140 dBc) is much lower than the phase-noise around the carrier, this does not affect the phase-noise in the range of interest (−95 dBc at 10 kHz offset.)

Figure 4:
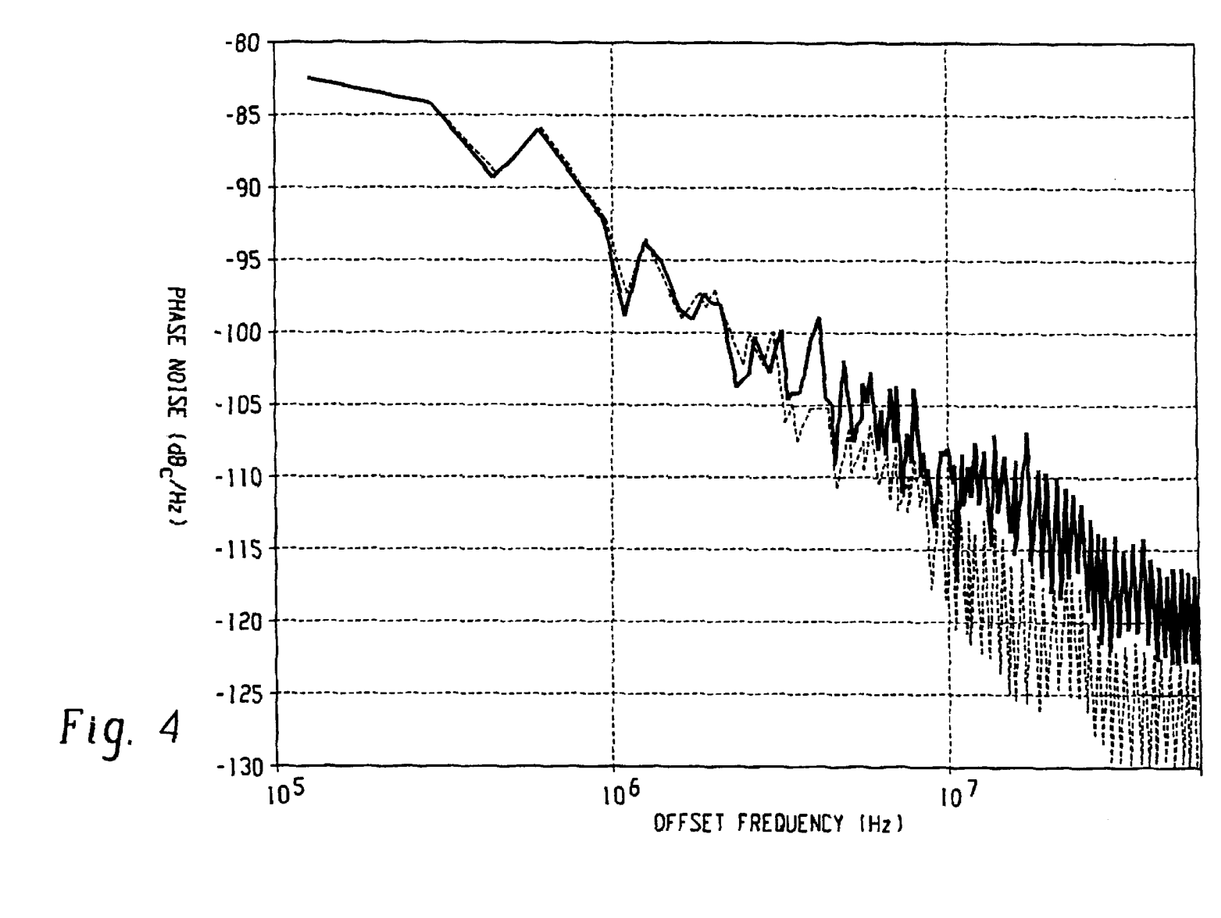
FIG. 4 is a plot showing noise aliasing simulations in the first embodiment shown in FIG. 2.
Figure 5:
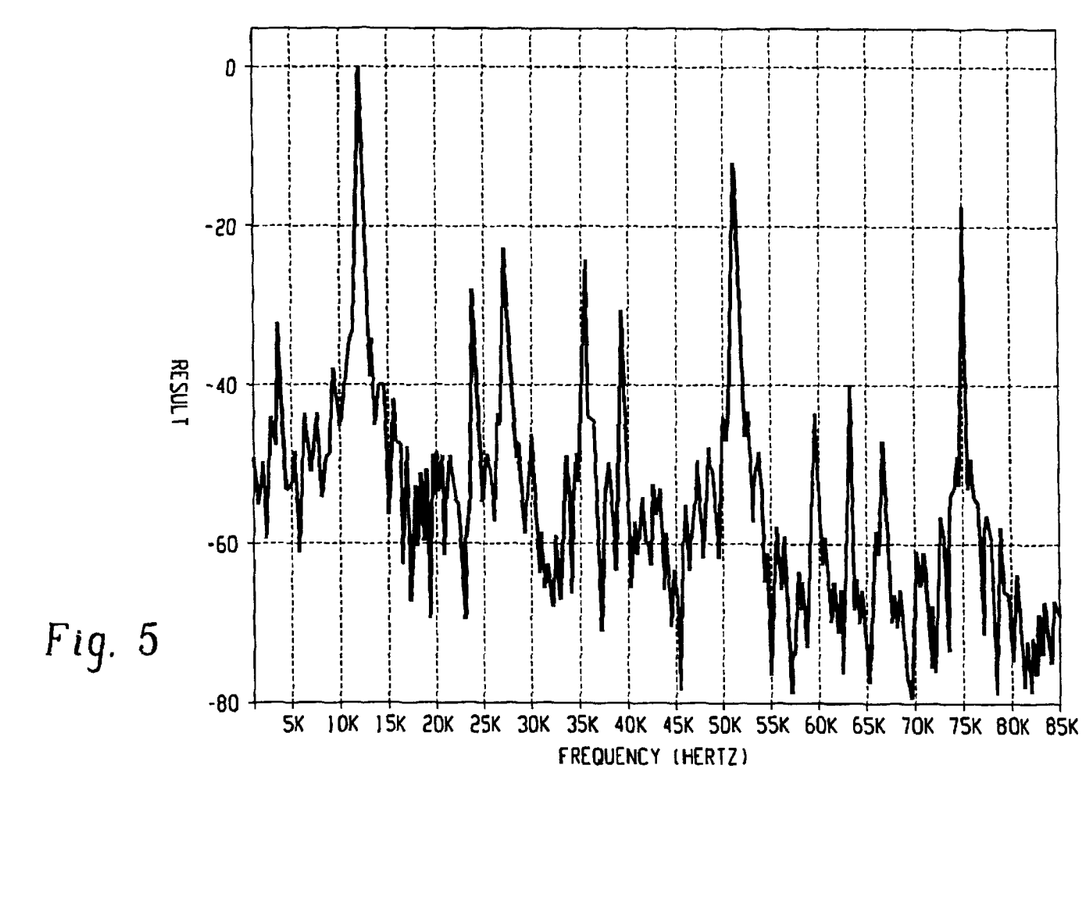
FIG. 5 is a simulation plot of the current-mode sampler circuit shown in FIG. 5.

Matlab simulations showing noise aliasing, which are shown in FIG. 4, further illustrate the effect of sub-sampling on the phase-noise. Here, the VCO 22, which is running at 1 GHz, is modulated with a noise source creating the phase-noise indicated by the dotted line. The solid line represents the phase-noise of the sampler 24 output. The noise floor of the VCO 22 is around −130 dBc. The output of the VCO 22 is sampled at 92 MHz. As shown, noise aliasing has no effect on the phase-noise until 10 MHz, at which point the noise is sufficiently attenuated by the loop response.

Another important consideration is the spurs generated by the sub-sampler 24. Spurious tones will be generated, not only by any sampler 24 non-linearities, but also by the harmonics of the VCO signal. For example, suppose the sampling frequency is $f_S$ and the output of the sampler has a fundamental frequency of $f_O$. The second and third harmonics of the input signal (from the VCO 22) will result in tones at $2f_O$ and $3f_O$, respectively. These tones, being a multiple of the fundamental frequency, will cause no jitter and will not affect the loop performance. Due to sampling, however, images will be created at $f_S-f_O$, $f_S-2f_O$ and $f_S-3f_O$, resulting in added jitter. The affect of these spurs must be minimized through reducing the VCO harmonics and/or careful frequency planning such that these spurs lie outside the filter passband.

Figure 6:
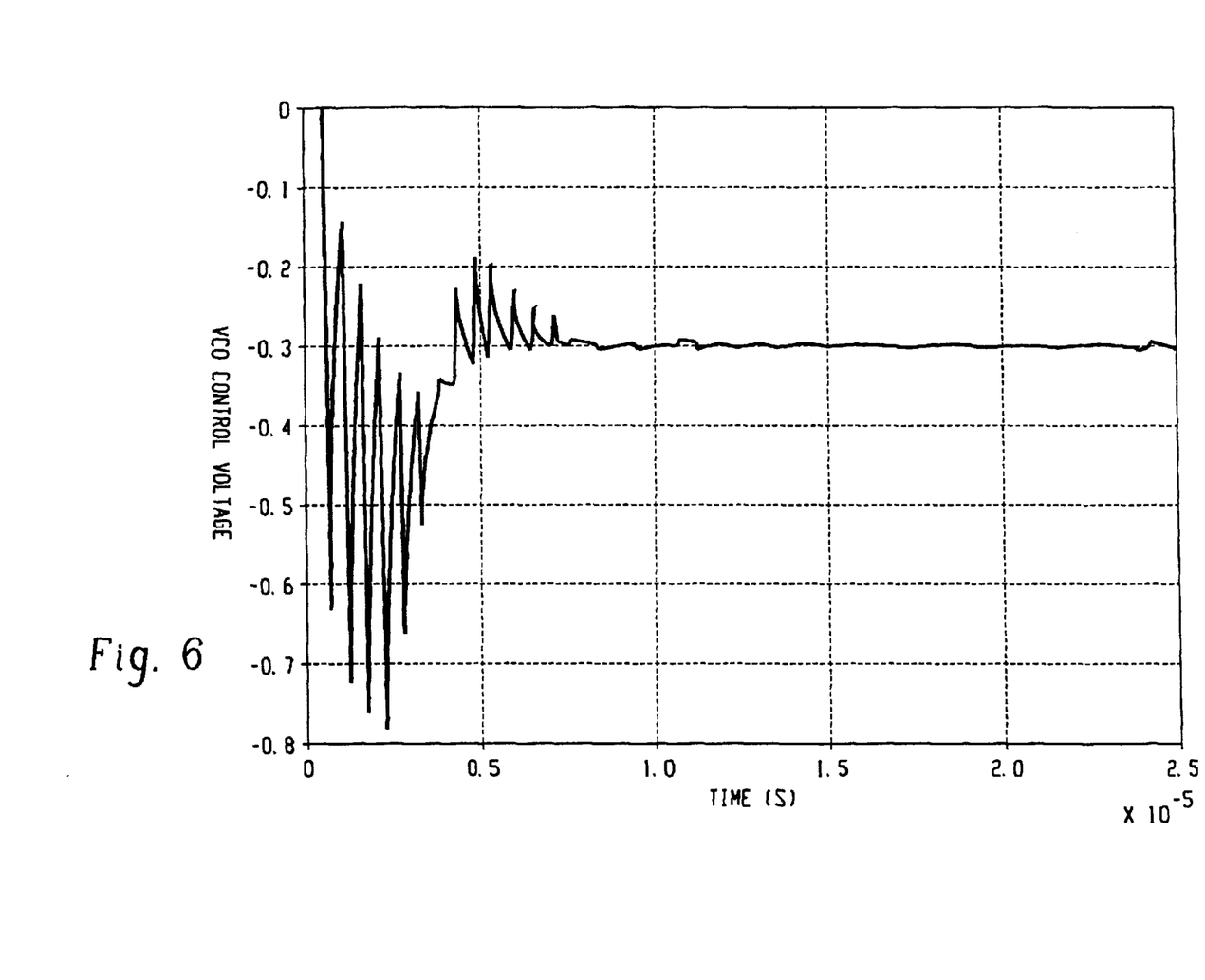
FIG. 6 is a simulation plot showing the PLL transient response in the first embodiment shown in FIG. 2.
Figure 7:
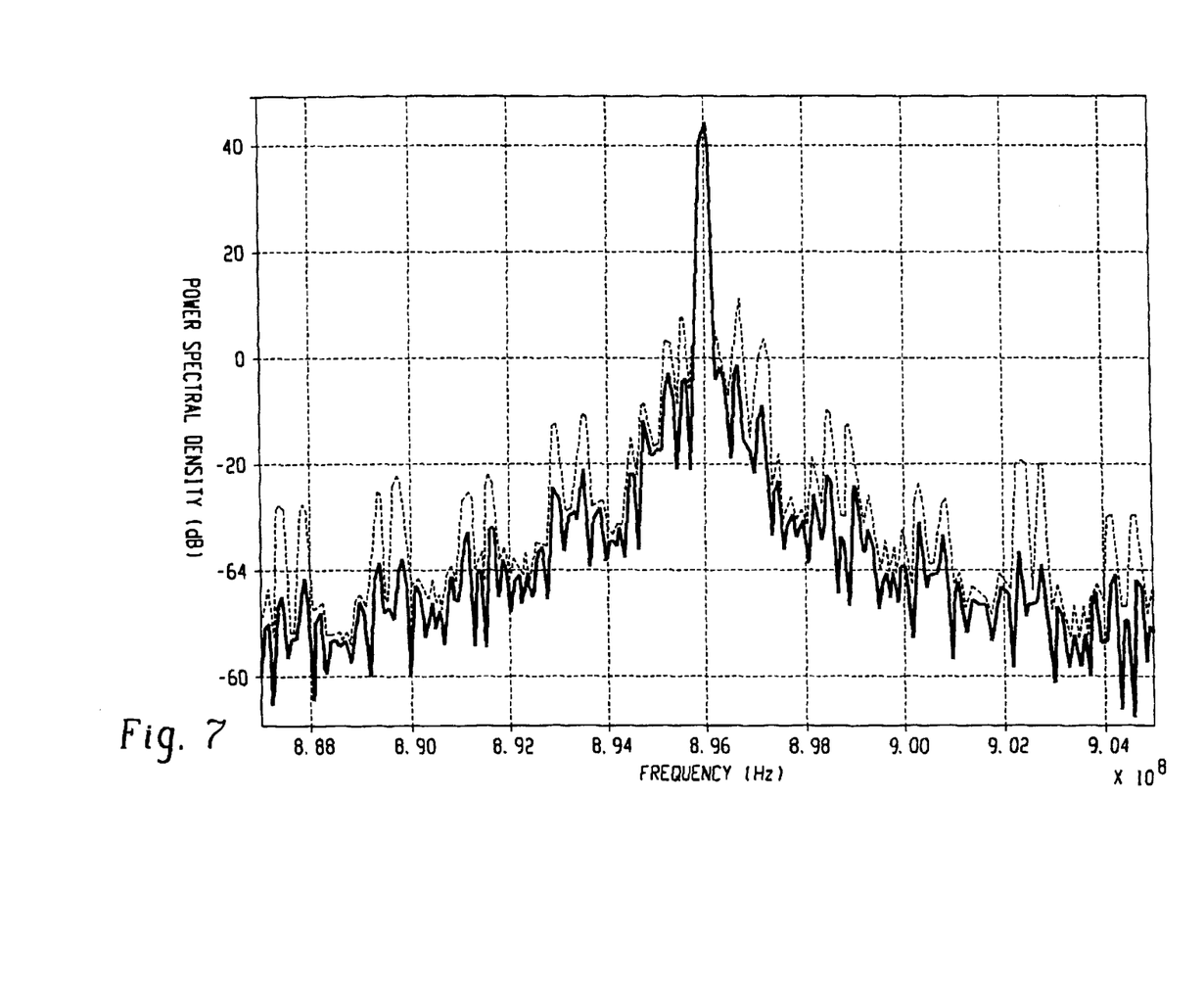
FIG. 7 is a simulation plot showing the output of the VCO using a 6th-order low pass filter (solid line), and a 4th-order low pass filter (dashed line) in the first embodiment shown in FIG. 2.

As is shown in FIG. 6, the system of FIG. 2 was simulated using Simulink™ from Matlab. This figure shows the circuit's transient response. In this simulation the VCO gain was 10 MHz/V, the loop bandwidth 80 kHz, and the damping factor 0.707. The LPF 26 used was a 6th-order Butterworth filter with a cutoff frequency of 16 MHz. The curve in FIG. 6 shows the transient response of the loop for a 3 MHz frequency step.

Figure 8:
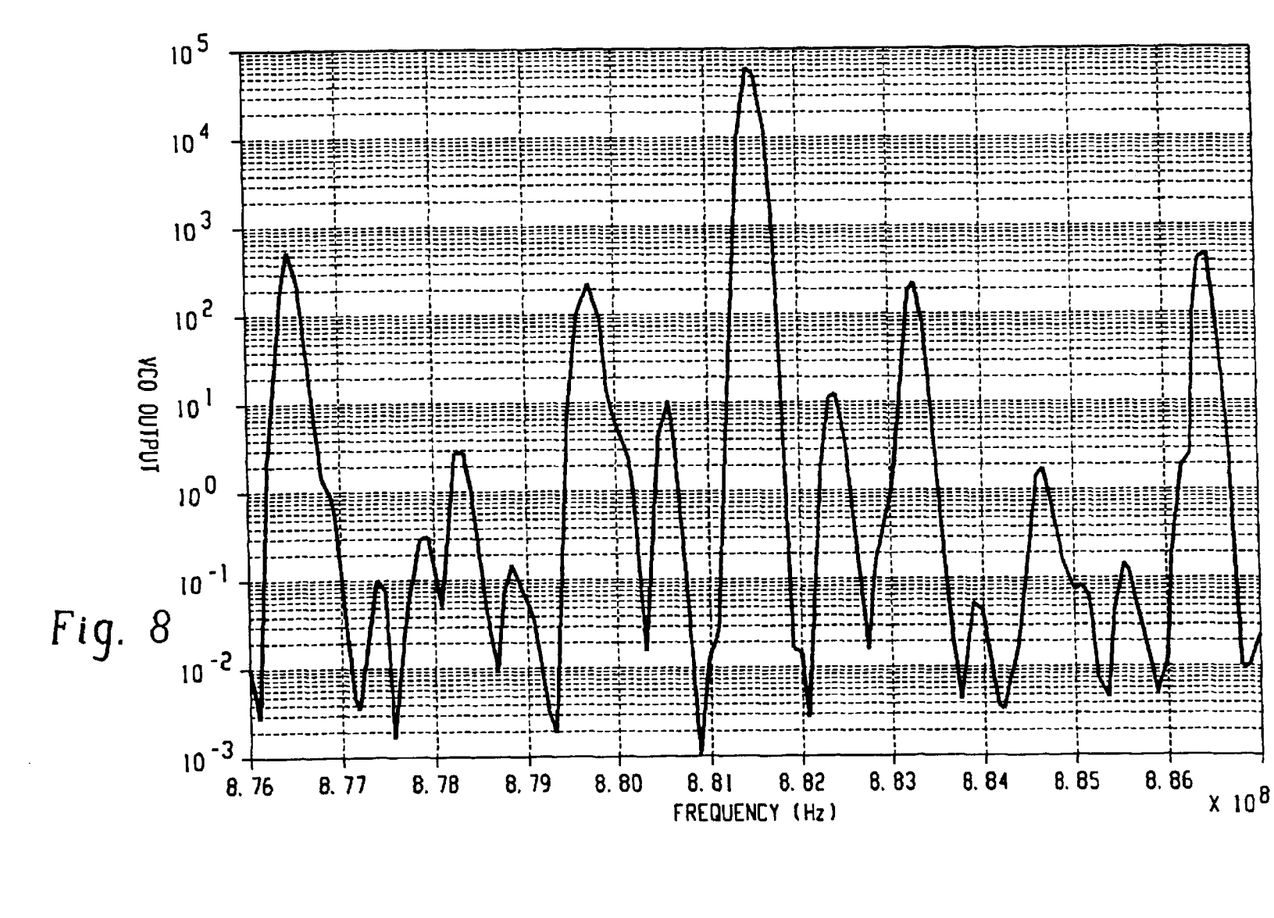
FIG. 8 is a simulation plot showing the VCO phase-noise suppression in the first embodiment shown in FIG. 2.

The spectrum of the VCO output is shown as a solid line in FIG. 8. The spurs are −50 dBc down. These spurs could be further reduced by using a higher-order LPF, or by reducing the loop bandwidth. The effect of the LPF order on the output spurs is shown as a dotted line in FIG. 8. As is clearly shown, when a 4th-order filter is used the spurs increase by approximately 10 dB.

Turning to FIG. 8, the VCO's phase-noise suppression was also simulated. For a bandwidth of 80 KHz, it is necessary to use an excessively large number of points for FFT in order to get a sufficient resolution. Thus the loop parameters where changed in order to increase the loop bandwidth. The VCO output was around 881.5 MHz, sampled at 87 MHz. The LPF 26 was a 4th-order filter with a cutoff frequency of 32 MHz. The bandwidth was set to 1.8 MHz. Three equal tones where injected at the output of the VCO 22 at offsets of 0.9, 1.8 and 5 MHz. This figure shows the VCO output when configured in the loop. As shown, the tone within the loop bandwidth was attenuated by approximately 17 dB, while the one outside the bandwidth was not attenuated. As expected, the tone at 1.8 MHz was attenuated by only 3 dB.

Further considerable power savings is obtained by the system in this first embodiment by eliminating the prescaler (divider circuit) and using a preferred op-amp configuration for the LPF. In regards to the prescaler, since the division-by-N block in the classical PLL follows the VCO directly, its first few stages operate at a very high frequency and consume a large portion of the power. In the first embodiment, the divide-by-N block 28 operates at a low frequency and dissipates only small dynamic power. In regards to the LPF 26, the operational amplifiers needed for the LPF 26 in this embodiment operate at less than 30 Mhz. With such relaxed settling-time constraints, they can be biased at small currents.

Figure 9:
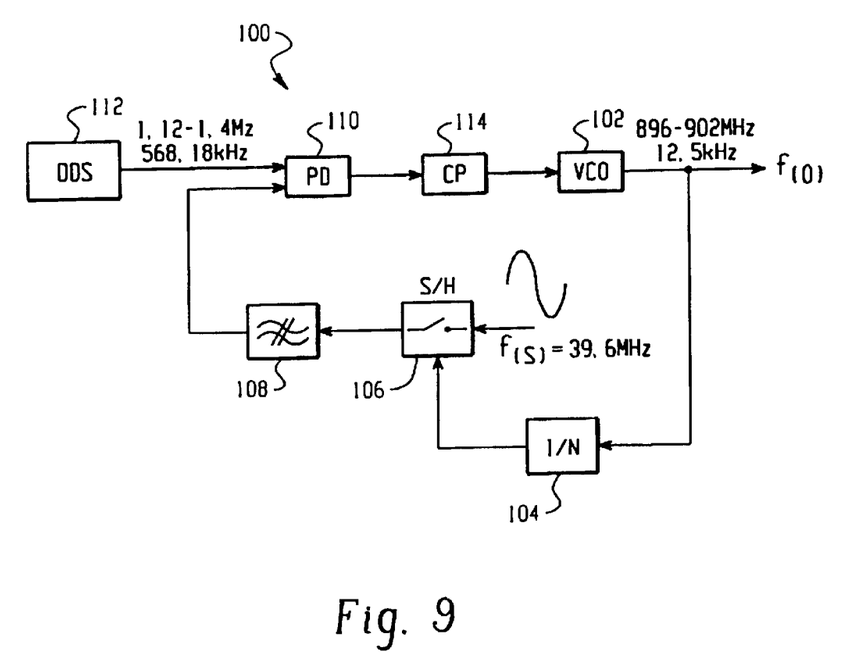
FIG. 9 is a circuit schematic of a second embodiment of a phase-locked loop frequency synthesizer.

An alternative embodiment is shown in FIG. 9. Similar to the first embodiment, a VCO 102 is configured in a feedback loop. The output of the VCO 102 ($f_O$) is divided down to an intermediate frequency using a simple, low-power fixed-modulus counter, i.e., a divider circuit, 104. Preferably, the divider circuit 104 is a 1/N divider circuit with N=22, although other values of N could be used. The output of the divider 104 then samples a fixed-frequency sinusoidal signal $f_S$ in the sampler 106, e.g., a sample-and-hold circuit. The beat frequency output from the sampler 106 is then filtered by a low-order LPF 108. The filtered signal is then fed to the PLL input at phase detector 110. The reference input to the PLL phase detector 110 comes from another frequency synthesizer, e.g., a DDS 112. The signal output by the phase detector 110 is then filtered by a loop-filter 114, which also determines the bandwidth and spurious rejection, and is then fed to the input of the VCO 102.

In this architecture, instead of sub-sampling the VCO 102 by a fixed reference (as in FIG. 2), the divided VCO output samples a fixed signal. The divider output is the sampling signal, while the fixed reference $f_S$ is the sampled signal. The purpose of this modification is to make the reference frequency ($f_S$) and the sampling frequency close to each other, which reduces the requirement on the lower LPF 108. Since crystal oscillators operating at RF frequencies are not readily available, the VCO frequency must be-divided first before sampling. After the divider 104, however, a square wave results that contains odd harmonics. Sampling such a signal creates further images from these harmonics.

In the configuration shown in FIG. 9, the VCO signal is the sampling signal, while the sampled signal is a pure sine wave coming from a crystal oscillator (not shown). Hence, no harmonics are generated.

The utilization of this architecture further reduces the division ratio (N) as compared to the prior art systems, while maintaining a low operating frequency for the DDS 112. The division ratio (N) for the system in FIG. 9 is only 22 versus 644 if the sampling mixer was not used. This provides more than 29 dBc attenuation of the phase-noise from the phase-detector and DDS signal. This will also influence the number of bits needed for the DAC (not shown) of the DDS 112. Since the truncation noise associated with the DAC translates into phase-noise, this significantly reduces the DAC power consumption.

This architecture also effects the DDS 112 size and power consumption. The VCO output is converted down to the 1.4 MHz range with a division ratio of only 22. Thus, the DDS 112 will have to provide a resolution of 568.18 Hz with a clock of approximately 3.5 MHz. Hence, only 13 bits of resolution will be sufficient versus 18 bits if no mixing was employed, as discussed above in reference to the prior art systems. This leads to a significant reduction in the DDS 112 size and power consumption.

In addition to reducing the division ratio N, this architecture employs a relatively high reference frequency (1–1.4 MHz as opposed to 12.5 kHz in a classical PLL). This allows for a large bandwidth while maintaining low spurious signals. A bandwidth of 100 kHz will still be one decade less than the spurious frequency while providing nearly 40 dBc attenuation of the VCO phase-noise at 10 kHz. This makes the use of on-chip VCOs, which usually have low quality factors, possible and thus greatly reduces the interference problems as well as avoiding the extra buffers needed to drive external 50-Ohm terminations. The large bandwidth is also beneficial in that it provides a fast switching time.

Figure 10:
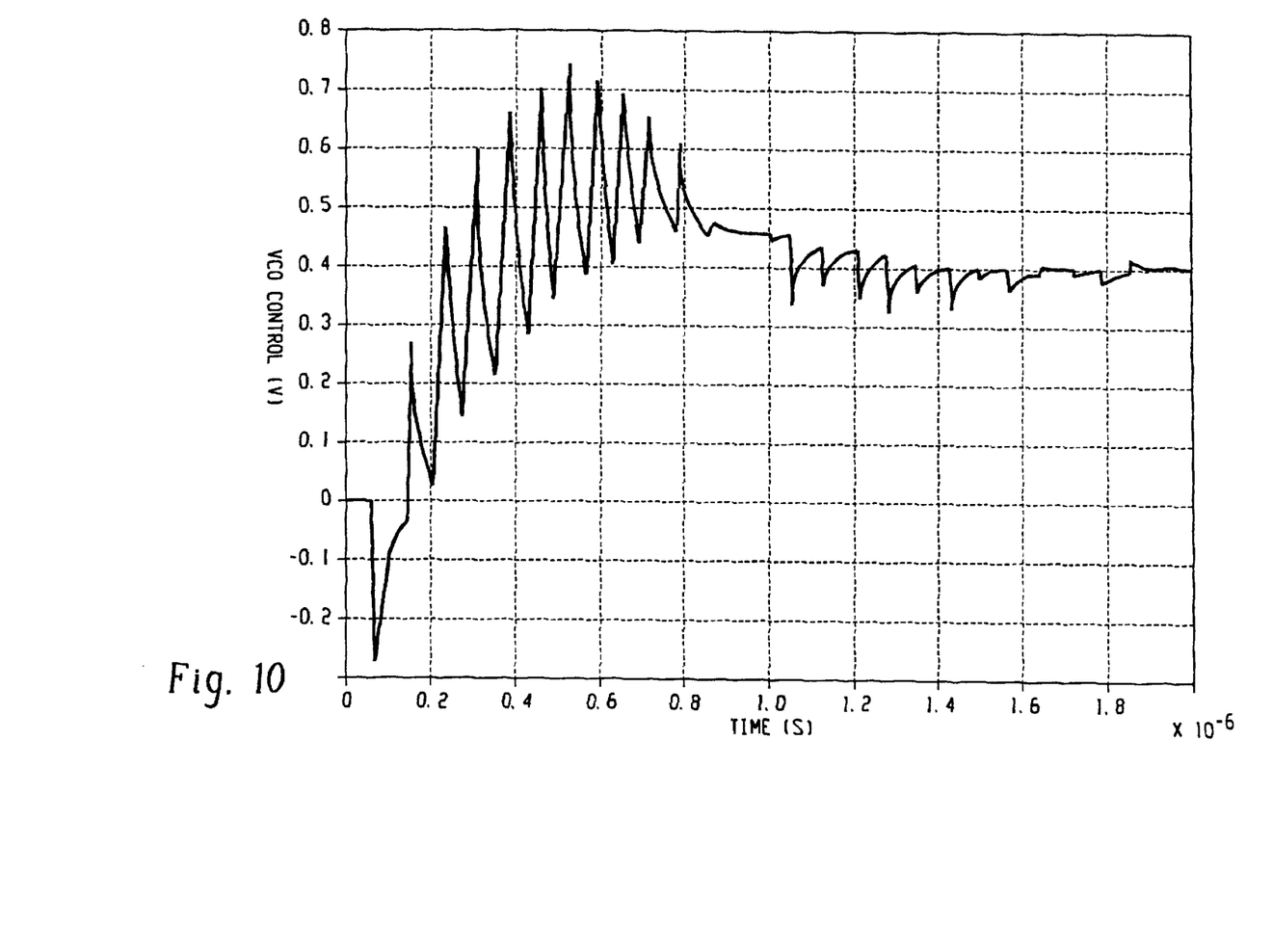
FIG. 10 is a simulation plot of the transient operation of the VCO input for a 6 MHz frequency step in the second embodiment shown in FIG. 9.

The embodiment shown in FIG. 9 was simulated using Simulink from Matlab. The loop bandwidth was set to 67.5 kHz and the damping factor was 0.707. The transient response of the loop, for a 6 Mhz frequency step, is shown in FIG. 10. As seen in this figure, the response follows that of a second-order system with the expected natural frequency.

Figure 11:
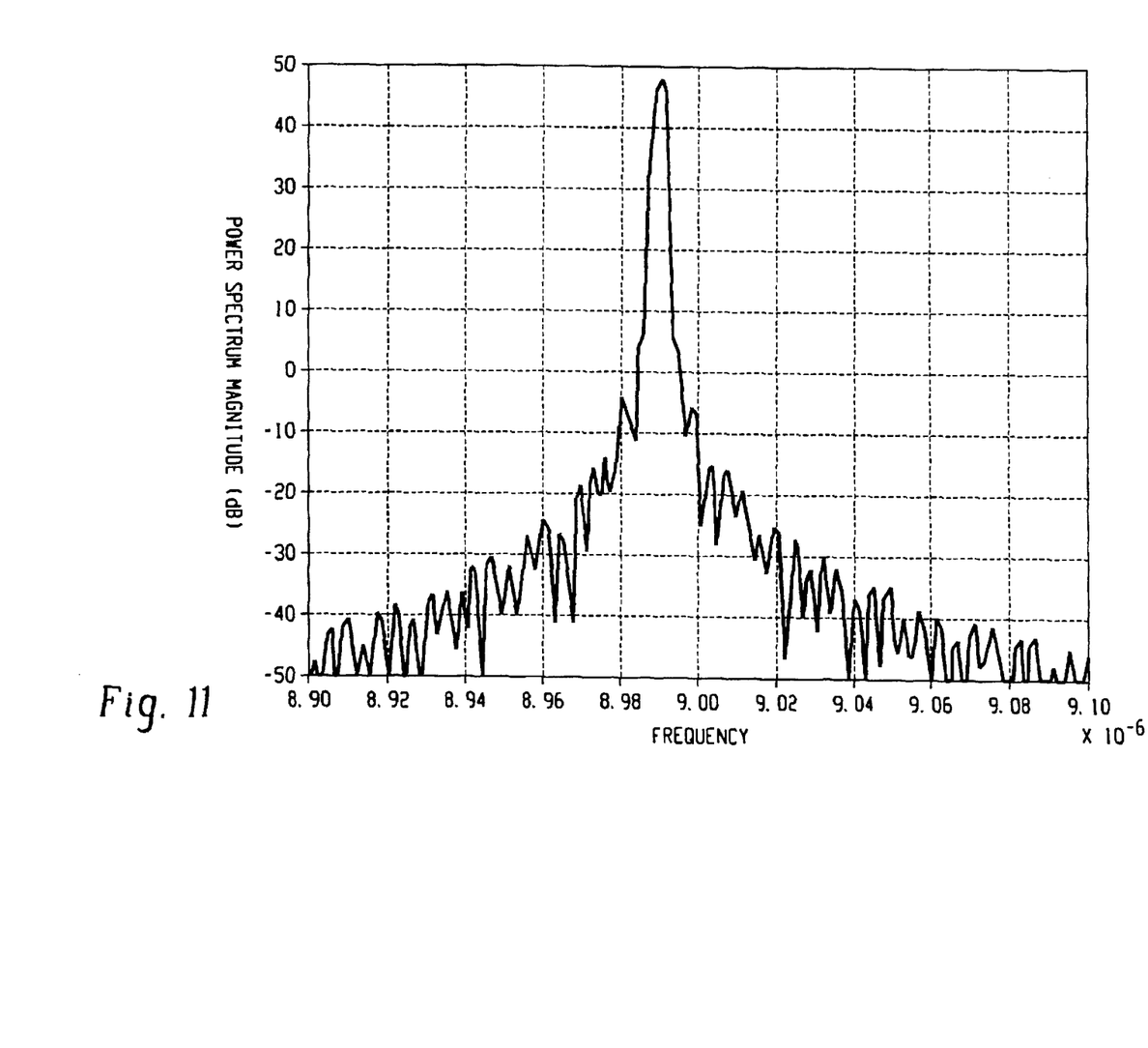
FIG. 11 is a simulation plot of the VCO output spectrum in the second embodiment shown in FIG. 9.

The spectrum of the VCO output $f_O$ is shown in FIG. 11. In this case, a simple 1st order LPF 108 was used after the sampling mixer 106 to reject the harmonics. As can be seen in this figure, the spurs are approximately −55 dBc down. These spurs could be further reduced by using a higher order LPF108, or by reducing the loop bandwidth.

Figure 12:
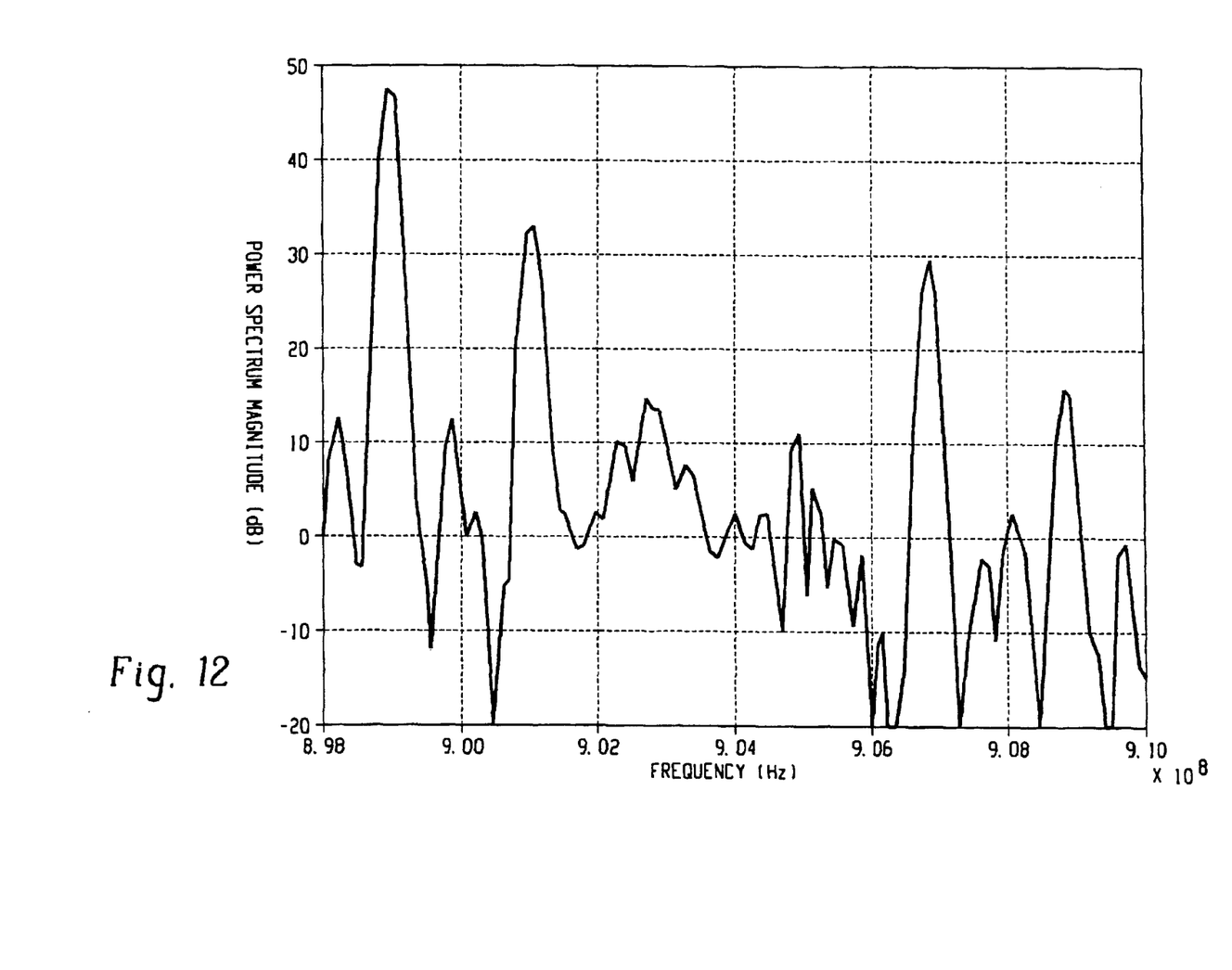
FIG. 12 is a simulation plot of the loop suppression of the VCO noise in the second embodiment shown in FIG. 9.

As shown in FIG. 12, the suppression of the VCO phase-noise was also simulated. For a bandwidth of 67.5 Khz it is necessary to use an excessively large number of points for FFT in order to get sufficient resolution. Thus, the loop parameters were changed in order to increase the loop bandwidth. The VCO output was 899 MHz and sampled at 80 MHz. The reference to the phase-detector 110 was 9.9 MHz and the bandwidth was set to 2 MHz. In order to simulate the VCO phase-noise, three equal tones were injected in the VCO phase at 0.8 MHz, 2 MHz, and 7.83 MHz. As is clearly seen in this figure, the tone within the loop bandwidth was attenuated by approximately 18 dB, while the one outside the bandwidth was not attenuated. The tone at 2 MHz increased by approximately 3 dB. This is attributed to the peaking of the transfer function around the bandwidth.

Conclusion

Other variations from these systems and methods should become apparent to one of ordinary skill in the art without departing from the scope of the invention defined by the claims. The embodiments described herein and shown in the drawings are examples of structures, systems or methods having elements corresponding to the elements of the invention recited in the claims. This written description and drawings may enable those skilled in the art to make and use embodiments having alternative elements that likewise correspond to the elements of the invention recited in the claims. The intended scope of the invention thus includes other structures, systems or methods that do not differ from the literal language of the claims, and further includes other structures, systems or methods with insubstantial differences from the literal language of the claims.

We claim:

1. A phase locked loop, comprising:
   a phase detector having as inputs a reference frequency signal and a feedback signal, the phase detector being operable to generate a phase detection signal based on a comparison of phases between the reference frequency signal and the feedback signal;
   a loop filter coupled to the phase detector for receiving the phase detection signal and for generating an output voltage in response to the phase detection signal;
   a voltage controlled oscillator coupled to the output voltage of the loop filter for generating a local oscillator signal; and
   a feedback circuit coupled to the local oscillator signal for generating the feedback signal, the feedback circuit comprising a sampling circuit, the sampling circuit being operable to sample the local oscillator signal with a sampling frequency that is substantially less than the frequency of the local oscillator signal to generate a sampling circuit output signal, the sampling circuit output signal comprising a beat frequency signal having a beat frequency that is equal to the frequency difference between the frequency of the local oscillator signal and the nearest harmonic of the sampling frequency, and wherein the feedback signal is derived from the beat frequency signal.

2. The phase locked loop of claim 1, wherein the loop filter comprises a low pass filter.

3. The phase locked loop of claim 1, wherein the loop filter comprises a charge pump.

4. The phase locked loop of claim 1, wherein the sampling frequency is derived from a crystal oscillator.

5. The phase locked loop of claim 1, wherein the sampling circuit comprises a sample-and-hold circuit.

6. The phase locked loop of claim 1, wherein the sampling frequency is not greater than about a half of the frequency of the local oscillator signal.

7. The phase locked loop of claim 1, wherein the sampling frequency is not greater than about a tenth of the frequency of the local oscillator signal.

8. An improved phase locked loop having (a) a phase detector for comparing a reference frequency signal with a feedback signal and for generating a phase detection signal based on the comparison between the reference frequency signal and the feedback signal, (b) a loop filter coupled to the phase detector and responsive to the phase detection signal for generating an output voltage, (c) a voltage controlled oscillator coupled to the output voltage for generating a local oscillator signal, and (d) a feedback circuit coupled to the local oscillator signal for generating the feedback signal, the improvement comprising:

a sampling circuit contained in the feedback circuit wherein the sampling circuit is operable to sample the local oscillator signal with a sampling frequency that is substantially less than the frequency of the local oscillator signal to generate a sampling circuit output signal, the sampling circuit output signal comprising a beat frequency signal having a beat frequency that is equal to the frequency difference between the frequency of the local oscillator signal and the nearest harmonic of the sampling frequency, and wherein the feedback signal is derived from the beat frequency signal.

9. The phase locked loop of claim 8, wherein the feedback circuit further comprises a low pass filter coupled to an output of the sampling circuit.

10. The phase locked loop of claim 9, wherein the feedback circuit further comprises a divider circuit coupled to an output of the low pass filter.

11. The phase locked loop of claim 10, wherein the divider circuit comprises a 1/N divider circuit that is characterized by a division ratio N, where N is an integer.

12. The phase locked loop of claim 8, wherein the sampling frequency is derived from a crystal oscillator.

13. The phase locked loop of claim 8, wherein the sampling circuit comprises a sample-and-hold circuit.

14. The phase locked loop of claim 8, wherein the sampling frequency is not greater than about a half of the frequency of the local oscillator signal.

15. The phase locked loop of claim 8, wherein the sampling frequency is not greater than about a tenth of the frequency of the local oscillator signal.

16. A method of controlling a phase locked loop having a phase detector, a voltage controlled oscillator, a loop filter coupled between an output of the phase detector and an input of the voltage controlled oscillator, and a feedback circuit coupled between an output of the voltage controlled oscillator and an input of the phase detector, comprising the steps of:

generating a local oscillator signal with the voltage controlled oscillator; and sampling the local oscillator signal in the feedback circuit using a sampling frequency that is substantially less than the frequency of the local oscillator signal to generate a sampling circuit output signal, the sampling circuit output signal comprising a beat frequency signal having a beat frequency that is equal to the frequency difference between the frequency of the local oscillator signal and the nearest harmonic of the sampling frequency, and wherein the feedback signal is derived from the beat frequency signal.

17. The method of claim 16 further comprising the step of:

reducing the frequency of the output frequency signal by applying a divider circuit.

18. The method of claim 16, wherein the sampling frequency is derived from a crystal oscillator.

19. The method of claim 16, wherein the sampling frequency is not greater than about a half of the frequency of the local oscillator signal.

20. The method of claim 16, wherein the sampling frequency is not greater than about a tenth of the frequency of the local oscillator signal.

* * * * *